United States Patent
Park et al.

(10) Patent No.: US 10,964,272 B2
(45) Date of Patent: Mar. 30, 2021

(54) DISPLAY MODULE

(71) Applicant: SAMSUNG DISPLAY CO., LTD., Yongin-si (KR)

(72) Inventors: Soyeon Park, Seoul (KR); Wonho Kim, Seongnam-si (KR); Keunsoo Lee, Hwaseong-si (KR); Jeongho Lee, Seoul (KR); Yanghee Kim, Yongin-si (KR); Hyungchul Lim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 32 days.

(21) Appl. No.: 16/369,595

(22) Filed: Mar. 29, 2019

(65) Prior Publication Data

US 2019/0311683 A1 Oct. 10, 2019

(30) Foreign Application Priority Data

Apr. 10, 2018 (KR) .................. 10-2018-0041752

(51) Int. Cl.
| | | |
|---|---|---|
| *G09G 3/3291* | (2016.01) | |
| *G09G 3/20* | (2006.01) | |
| *G09G 3/3266* | (2016.01) | |
| *G09G 3/3233* | (2016.01) | |
| *H01L 27/32* | (2006.01) | |

(52) U.S. Cl.
CPC ......... *G09G 3/3291* (2013.01); *G09G 3/2003* (2013.01); *G09G 3/3233* (2013.01); *G09G 3/3266* (2013.01); *H01L 27/3276* (2013.01); *G09G 2300/0426* (2013.01); *G09G 2300/0452* (2013.01)

(58) Field of Classification Search
CPC .. G09G 3/3291; G09G 3/2003; G09G 3/3233; G09G 3/3266; G09G 2300/0426; G09G 2300/0452; H01L 27/3276
See application file for complete search history.

(56) References Cited

U.S. PATENT DOCUMENTS

| | | |
|---|---|---|
| 9,341,905 B1 | 5/2016 | Li et al. |
| 9,362,322 B2 | 6/2016 | Ahn et al. |
| 9,377,657 B2 | 6/2016 | Okazaki et al. |
| 9,418,610 B2 | 8/2016 | Huang et al. |
| 9,558,689 B2 | 1/2017 | Yang et al. |
| 9,818,803 B2* | 11/2017 | Lee ............... H01L 27/3218 |
| 9,954,036 B2 | 4/2018 | Sato |
| 9,990,889 B2* | 6/2018 | Song ............... G09G 3/3291 |
| 10,043,450 B2 | 8/2018 | Shim |
| 10,096,594 B2* | 10/2018 | Chung ............ G09G 3/3225 |

(Continued)

FOREIGN PATENT DOCUMENTS

| | | |
|---|---|---|
| KR | 10-2014-0035239 | 3/2014 |
| KR | 10-2017-0052776 | 5/2017 |
| KR | 10-1789882 | 10/2017 |

*Primary Examiner* — Amare Mengistu
*Assistant Examiner* — Jennifer L Zubajlo
(74) *Attorney, Agent, or Firm* — F. Chau & Associates, LLC

(57) ABSTRACT

A display module includes first to third pixels emitting different colors, first light emission control lines connected to the first pixels among the first to third pixels, and second light emission control lines connected to the second pixels among the first to third pixels. Each of the first light emission control lines and each of the second light emission control lines are alternately arranged.

20 Claims, 8 Drawing Sheets

(56) References Cited

U.S. PATENT DOCUMENTS

| | | | | |
|---|---|---|---|---|
| 10,109,797 B2* | 10/2018 | Kwak | .................... | H01L 22/32 |
| 10,522,431 B2* | 12/2019 | Kim | ...................... | G09G 3/006 |
| 10,522,608 B2* | 12/2019 | Park | .................. | H01L 51/0031 |
| 10,679,561 B2* | 6/2020 | Kim | ...................... | G09G 3/006 |
| 10,686,017 B2* | 6/2020 | Eom | .................... | H01L 23/5384 |
| 2002/0015110 A1* | 2/2002 | Brown Elliott | ...... | G09G 3/3614 |
| | | | | 348/589 |
| 2003/0128179 A1* | 7/2003 | Credelle | ............. | G09G 3/3607 |
| | | | | 345/88 |
| 2005/0001542 A1* | 1/2005 | Kiguchi | .............. | H01L 27/3216 |
| | | | | 313/504 |
| 2006/0123293 A1* | 6/2006 | Kim | .................... | G09G 3/3291 |
| | | | | 714/724 |
| 2007/0035485 A1* | 2/2007 | Yoon | ................... | G09G 3/3208 |
| | | | | 345/76 |
| 2008/0111777 A1* | 5/2008 | Kim | .................... | G09G 3/3233 |
| | | | | 345/83 |
| 2011/0291550 A1* | 12/2011 | Kim | ................... | H01L 27/3216 |
| | | | | 313/504 |
| 2012/0056531 A1* | 3/2012 | Park | .................... | G09G 3/3233 |
| | | | | 313/506 |
| 2014/0367658 A1* | 12/2014 | Kwak | ................ | H01L 27/3276 |
| | | | | 257/40 |
| 2015/0041790 A1* | 2/2015 | Lee | .................... | H01L 27/3276 |
| | | | | 257/40 |
| 2015/0194357 A1* | 7/2015 | Lee | ........................ | H01L 22/32 |
| | | | | 324/762.02 |
| 2015/0362769 A1 | 12/2015 | Huang | | |
| 2016/0189663 A1* | 6/2016 | Hwang | ............... | G09G 3/3225 |
| | | | | 345/205 |
| 2017/0124953 A1* | 5/2017 | Shim | ................... | H01L 27/3248 |
| 2019/0279563 A1* | 9/2019 | Hwang | ............... | G09G 3/3233 |

* cited by examiner

<DATA WAVEFORM WHEN DRIVING RED LIGHT>

DISPLAY MODULE

CROSS-REFERENCE TO RELATED APPLICATIONS

This patent application claims priority under 35 U.S.C. § 119 to Korean Patent Application No. 10-2018-0041752, filed on Apr. 10, 2018, in the Korean Intellectual Property Office, the disclosure of which is incorporated by reference herein in its entirety.

TECHNICAL FIELD

The present inventive concept relates to a display module, and more particularly, to a display module including an organic light emitting device.

DISCUSSION OF RELATED ART

Organic light emitting display panels are used in multimedia devices such as a television, a mobile phone, a tablet computer, a navigator, and a game player. The organic light emitting display panels receive data signals from a data driver of a Chip On Flexible Printed Circuit (COF) scheme using data lines extended from the COF to the panels. The data lines of the COF may be short-circuited due to a high temperature, a high humidity, and a voltage difference between two adjacent data lines.

SUMMARY

According to an exemplary embodiment of the present inventive concept, a display module includes a first pixel group, a second pixel group, a data line group and a light emission control line group. The first pixel group includes pixels arrayed in a matrix type. The pixels include first pixels disposed in odd columns of odd rows and even columns of even rows and second pixels disposed in even columns of the odd rows and odd columns of the even rows. Each first pixel emits first light, and each second pixel emits second light having a different color from the first light. The second pixel group includes third pixels arrayed in a matrix type. Each third pixels emits third light having a different color from the first light and the second light. The data line group includes first data lines providing data signals to the first pixel group and second data lines providing data signals to the second pixel group. The light emission control line group includes first light emission control lines and second light emission control lines disposed alternately. The first light emission control lines respectively provide first light emission control signals to first pixels disposed in two adjacent rows among the first pixels. The second light emission control lines respectively provide second light emission control signals to second pixels disposed in two adjacent rows among the second pixels.

According to an exemplary embodiment of the present inventive concept, a display module includes first to third pixels, first and second data lines, and first and second light emission control lines. The first pixels each emits first light having a first color. The second pixels each emits second light having a second color different from the first color. The third pixels each emits third light having a third color different from the first color and the second color. The first data lines respectively provide data signals to corresponding first pixels among the first pixels and corresponding second pixels among the second pixels. The second data lines respectively provide data signals to corresponding third pixels among the third pixels. First light emission control lines respectively provide light emission control signals to only corresponding first pixels and corresponding third pixels among the first pixels, the second pixels and the third pixels. The second light emission control lures respectively provide light emission control signals to only corresponding second pixels and corresponding third pixels among the first pixels, the second pixels and the third pixels.

According to an exemplary embodiment of the present inventive concept, a display module includes first to third pixels emitting different colors, first light emission control lines connected to the first pixels among the first to third pixels, and second light emission control lines connected to the second pixels among the first to third pixels. Each of the first light emission control lines and each of the second light emission control lines are alternately arranged.

BRIEF DESCRIPTION OF DRAWINGS

The accompanying drawings are included to provide a further understanding of the inventive concept, and are incorporated in and constitute a part of this specification. The drawings illustrate exemplary embodiments of the inventive concept and, together with the description, serve to explain the principles of the inventive concept. In the drawings.

DETAILED DESCRIPTION OF EXEMPLARY EMBODIMENTS

Figure 1:
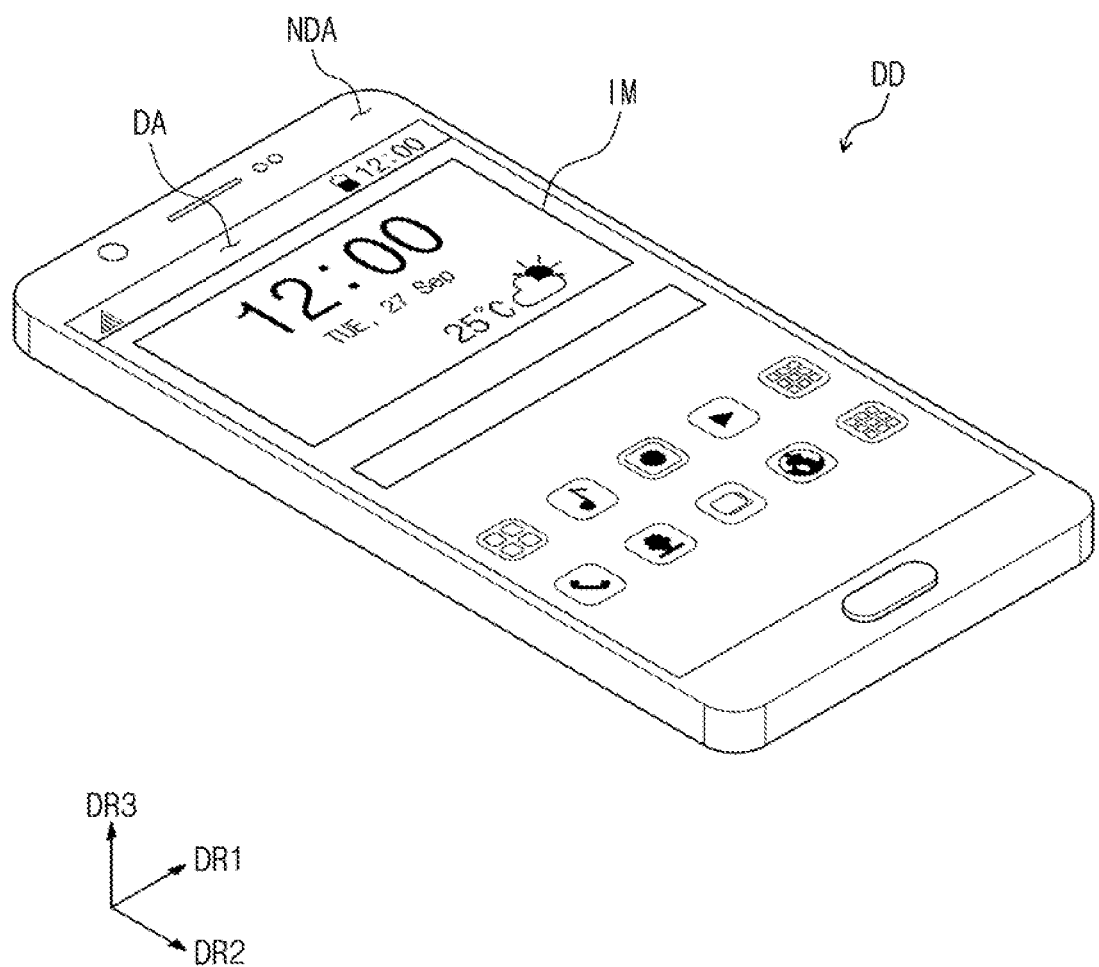
FIG. 1 is a perspective view of a display device according to an embodiment of the inventive concept.

Hereinafter, embodiments of the inventive concept will be described with reference to the accompanying drawings.

In addition, in the drawings, the ratios and the dimensions of the elements are exaggerated for effective description of the technical contents. The term "and/or" includes any and all combinations of one or more of the associated items.

FIG. 1 is a perspective view of a display device DD according to an embodiment of the inventive concept.

In FIG. 1, the display device DD is a smartphone. However, the inventive concept is not limited thereto, and the display device DD may be a medium or small-sized electronic device such as a mobile phone, a tablet computer, a vehicle navigator, a game device, or a smart watch as well as a large-sized electronic device such as a television or a monitor.

A display area DA and a non-display area NDA may be defined in the display device DD.

The display area DA on which an image IM is displayed is parallel to a surface defined by a first directional axis DR1 and a second directional axis DR2. A normal direction of the display area DA, namely, a thickness direction of the display device DD is indicated by a third directional axis DR3. A front surface (or top surface) and a rear surface (or bottom surface) of each member are separated in the third directional axis DR3. However, directions indicated by the first to third directional axis DR1, DR2, and DR3 are a relative concept and may be changed to other directions. Hereinafter, the first to third directions are respectively indicated by the first to third directional axes (DR1, DR2, and DR3) with the same reference numerals.

The non-display area NDA is an area which is adjacent to the display area DA, and on which the image IM is not displayed. A bezel area of the display device DD may be defined by the non-display area NDA. FIG. 1 illustrates application icons and a watch widget as an example of the image IM.

The non-display area NDA may surround the display area DA. However, the inventive concept is not limited thereto, and the shape of the display area DA and the shape of the non-display area NDA may be relatively designed.

Figure 2A:
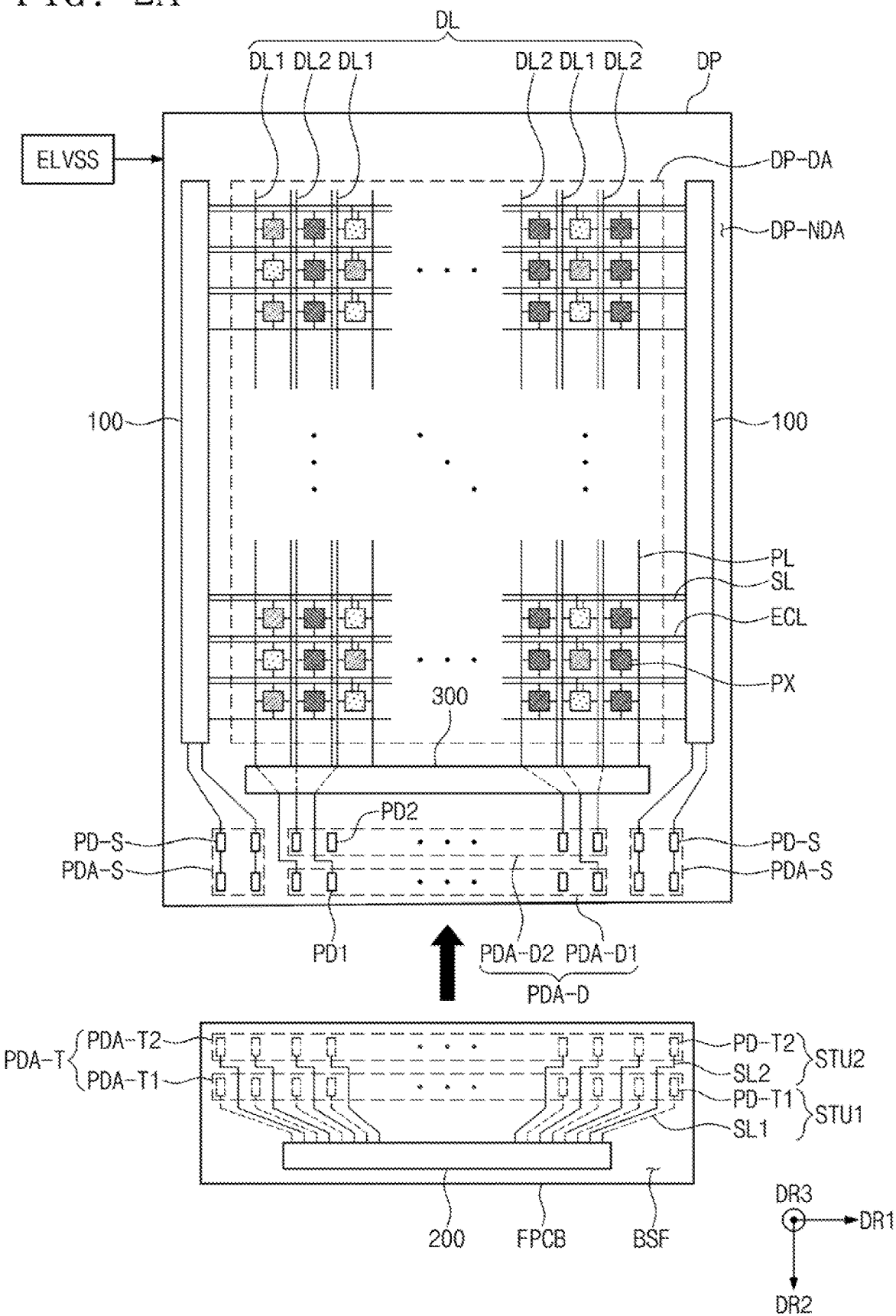
FIG. 2A illustrates block diagrams of a display panel and a printed circuit board according to an embodiment of the inventive concept.
Figure 2B:
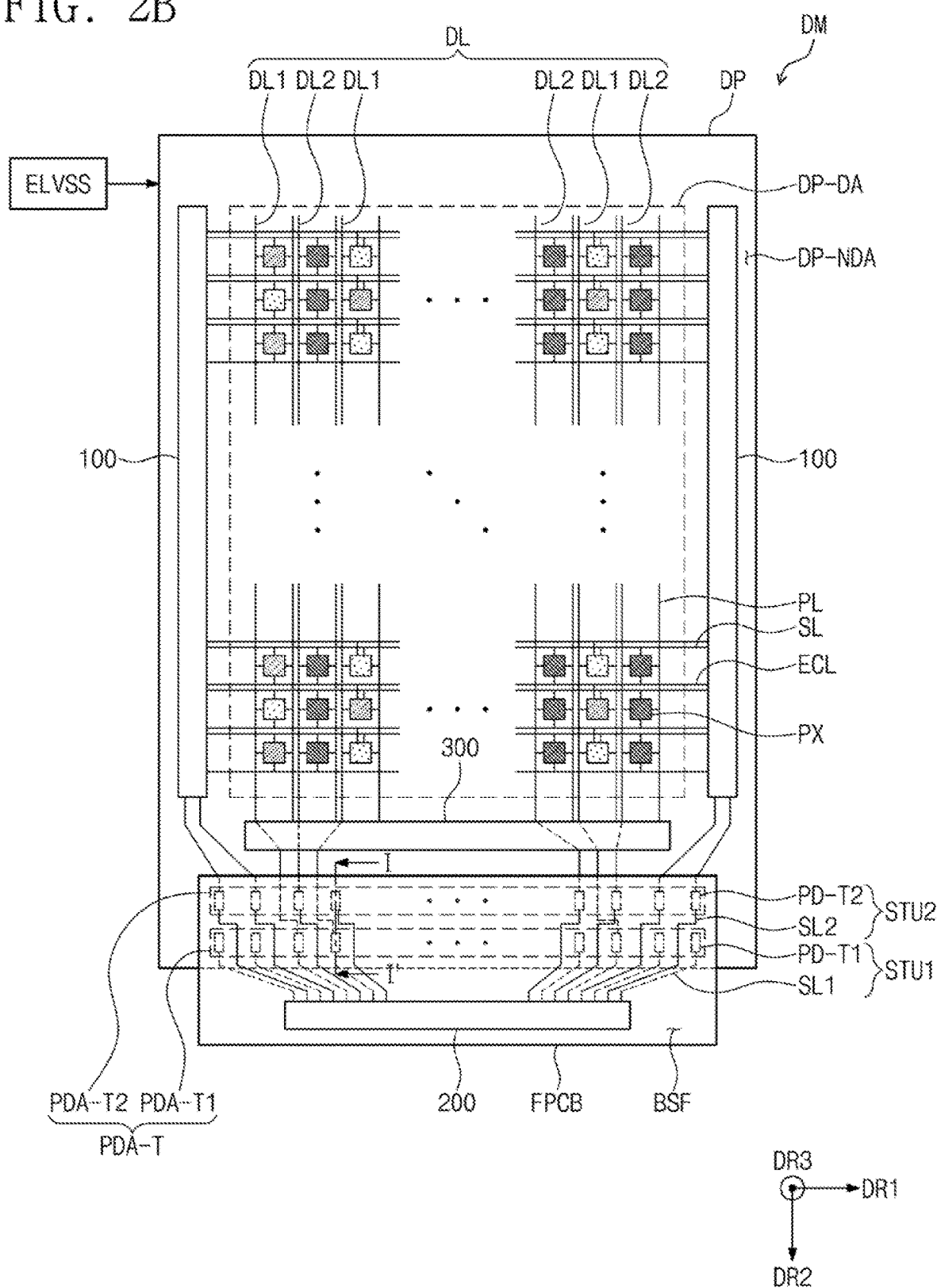
FIG. 2B illustrates a block diagram of a display module in which the display panel and the printed circuit board illustrated in FIG. 2A are combined.

FIG. 2A illustrates block diagrams of a display panel DP and a printed circuit board FPCB according to an embodiment of the inventive concept. FIG. 2B illustrates a block diagram of a display module DM in which the display panel DP and the printed circuit board FPCB illustrated in FIG. 2A are combined.

The display panel DP includes the display area DP-DA and a non-display area DP-NDA on a plane. The non-display area DP-NDA is defined along an edge of the display area DP-DA. The display area DP-DA and the non-display area DP-NDA of the display panel DP may respectively correspond to the display area DA and the non-display area NDA of the display device DD illustrated in FIG. 1.

The display panel DP includes a control signal driver 100, a plurality of scan lines SL, a plurality of light emission control lines ECL, a plurality of data lines DL, a plurality of power lines PL, and a plurality of pixels PX (hereinafter, pixels). The pixels PX are disposed in the display area DP-DA. Each of the pixels PX includes an organic light emitting diode OLED (see FIG. 3) and a pixel circuit CC (see FIG. 3) connected thereto.

The pixels PX include first pixels PX1 emitting light having a red color, second pixels PX2 emitting light having a blue color, and third pixels PX3 emitting light having a green color. The first pixels PX1 and the second pixels PX2 are alternately disposed in the first direction DR1 and the second direction DR2. The third pixels PX3 are consecutively disposed in the second direction DR2.

However, the inventive concept is not limited thereto. For example, the colors may be emitted from different pixels of the first to third pixels PX1 to PX3. In addition, a scheme in which the first to third pixels PX1 to PX3 are disposed may also be changed to another one. Detailed descriptions about the first to third pixels PX1 to PX3 will be provided with reference to FIG. 7.

The control signal driver 100 may include a scan driver and a fight emission control driver.

The scan driver may generate scan signals, and the generated scan signals may be sequentially supplied to the scan lines SL. The light emission control driver may generate light emission control signals, and the generated light emission control signals are supplied to the light emission control lines ECL.

In the control signal driver 100, the scan driver and the light emitting control driver may be stand-alone components. The present inventive concept is not limited thereto. For example, the scan driver and the light emitting control driver may be integrated in one circuit to form the control signal driver 100.

The control signal driver 100 may include a plurality of thin-film transistors fabricated using a process for fabricating a driving circuit of the pixels PX, for example, a Low Temperature Polycrystalline Silicon (LTPS) process or a Low Temperature Polycrystalline Oxide (LTPO) process.

A data driver 200 supplies data signals to the data lines DL. The data signals have analog voltages corresponding to gradation values of image data. The data driver 200 will be described in detail.

The scan lines SL are extended in the first direction DR1 and arranged in the second direction DR2 intersecting with the first direction DR1. In an embodiment of the inventive concept, the first direction DR1 and the second direction DR2 may be orthogonal, but are not limited thereto. The scan lines SL may form a scan line group.

The light emission control lines ECL are extended in the first direction DR1 and arranged in the second direction DR2. In other words, each of the light emission control lines ECL may be arrayed in parallel to each corresponding scan line among the scan lines SL. The light emission control lines ECL may form a light emission control line group.

The data lines DL are extended in the second direction DR2 and arranged in the first direction DR1 intersecting with the second direction DR2. The data lines DL may provide the data signals to the corresponding pixels PX. The data lines DL may form a data line group.

The data lines DL include first data lines DL1 and second data lines DL2. The first data lines DL1 are respectively and electrically connected to the first pixels PX1 and the second pixels PX2 alternately disposed in the second direction DR2. The second data lines DL2 are respectively and electrically connected to the third pixels PX3 consecutively disposed in the second direction DR2.

The non-display area DP-NDA includes a data pad part PDA-D and a scan pad part PDA-S.

The data pad part PDA-D includes a first data pad part PDA-D1 and a second data pad part PDA-D2. The first data pad part PDA-D1 includes a plurality of first data pads PD1. The second data pad part PDA-D2 includes a plurality of second data pads PD2. The second data pad part PDA-D2 is disposed between the first data pad part PDA-D1 and the display area DP-DA.

The first data pads PD1 are respectively connected to the first data lines DL1. The second data pads PD2 are respectively connected to the second data lines DL2.

The scan pad part PDA-S may include a plurality of scan pads PD-S.

Power lines PL are extended in the second direction DR2 and arranged in the first direction DR1. The power lines PL are electrically connected to a first power supply voltage member (or line, or electrode) 300 to supply a first power supply voltage ELVDD (FIG. 3) to a plurality of corresponding pixels PX.

Each of the plurality of pixels PX is connected to a corresponding scan line among the scan lines SL, a corresponding light emission control line among the light emission control lines ECL, a corresponding data line among the data lines DL, and a corresponding power line among the power lines PL.

The pixels PX may be arrayed in a plurality of rows.

The printed circuit board FPCB includes a base film BSF, a plurality of first signal transfer units STU1, and a plurality of second signal transfer units STU2. The data driver 200 is embedded in the printed circuit board FPCB to be electrically connected to the first signal transfer units STU1 and the second signal transfer units STU2.

Each of the first signal transfer units STU1 includes a first transfer pad PD-T1 and a first transfer line SL1. Each of the second signal transfer units STU2 includes a second transfer pad PD-T2 and a second transfer line SL2.

The first transfer pads PD-T1 form a first transfer pad part PDA-T1 and the second transfer pads PD-T2 form the second transfer pad part PDA-T2. The first transfer pad part PDA-T1 and the second transfer pad part PDA-T2 form a transfer pad part PDA-T.

To form the display module DM, the print circuit board FPCB, and the scan pad part PDAS-S and the data pad part PDA-D of the display panel DP are overlapped to form electrical connections therebetween. For example, a part of the first transfer pads PDT1 of the first transfer pad part PDA-T1 is electrically connected to the first data pads PD1 of the first data pad part PDA-D1. The remaining of the first transfer pads PD-T1 of the first transfer pad part PDA-T1 is electrically connected to a part of the scan pads PDS. A part of the second transfer pads PD-T2 of the second transfer pad part PDA-T2 is electrically connected to the second data pads PD2 of the second data pad part PDA-D2. The remaining of the second transfer pads PD-T2 of the second transfer pad part PDA-T2 is electrically connected to the remaining of the scan pads PD-S. An additional description about the printed circuit board. FPCB will be provided with reference to FIG. 6.

The data driver 200 may provide data signals of a pulse wave type to the first pixels PX1 and the second pixels PX2 through the first signal transfer units STU1. The data driver 200 may provide data signals of a DC type to third pixels PX3 through the second signal transfer units STU2.

Figure 3:
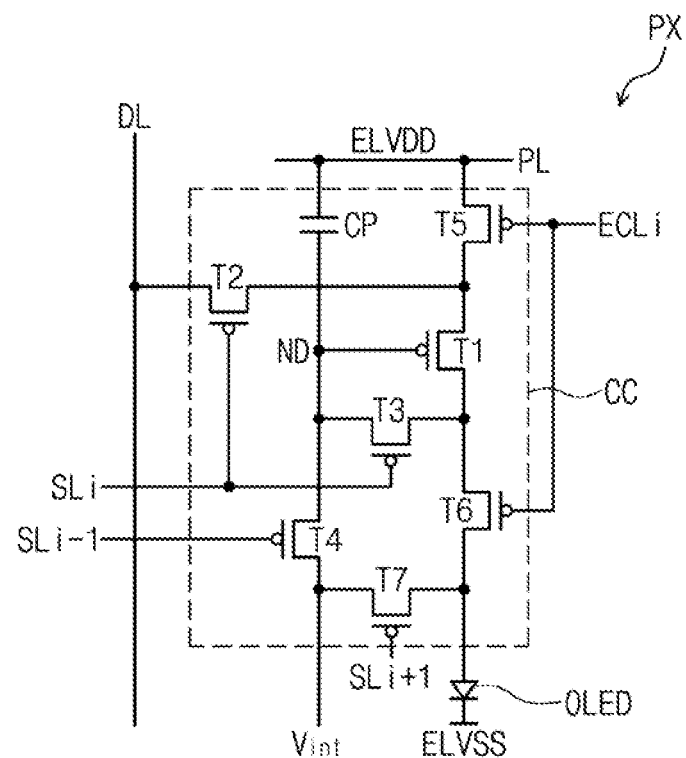
FIG. 3 illustrates a circuit diagram of a pixel according to an embodiment of the inventive concept.
Figure 4:
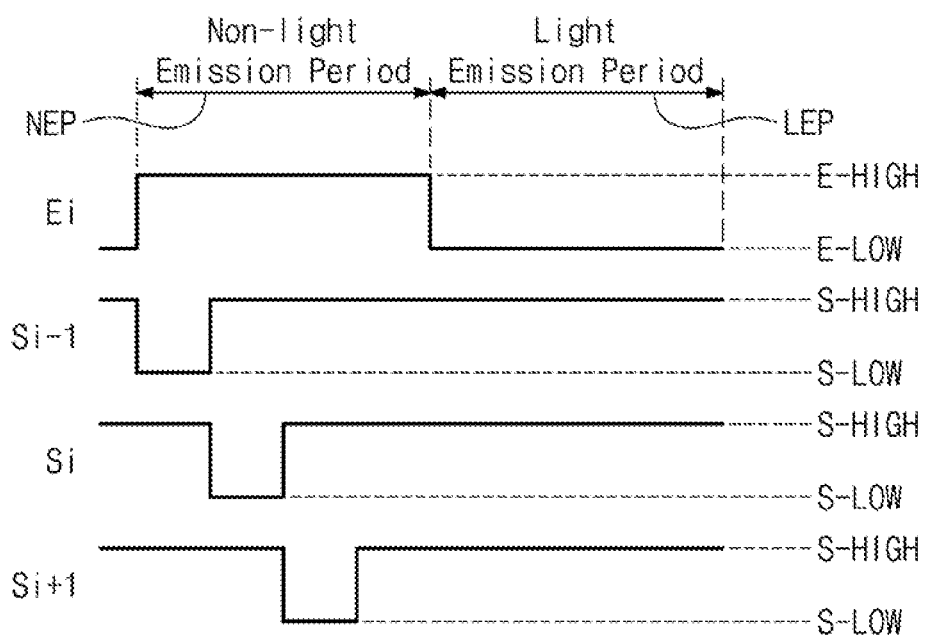
FIG. 4 illustrates a light emission control signal and scan signals to be applied to the pixel of FIG. 3.

FIG. 3 shows a circuit diagram of a pixel PX according to an embodiment of the inventive concept. FIG. 4 shows signal waveforms of a light emission control signal Ei, and scan signals Si-1, Si, and Si+1 to be applied to the pixel PX of FIG. 3. In FIG. 3, it is assumed for the convenience of a description that a pixel PX is controlled by control signals received from an i-th scan line SLi and an i-th light emission control line ECLi to emit a light. In this case, an (i-1)th scan line SLi-1 and an (i+1)th scan line SLi+1 adjacent to the i-th scan line SLi supply signal to initialize the pixel PX.

The pixel PX includes an organic, light emitting device OLED, and a pixel circuit CC. The pixel circuit CC includes seven transistors and one capacitor. For example, the pixel circuit CC includes a plurality of transistors T1 to and a capacitor CP. The pixel circuit CC controls a current amount flowing through the organic light emitting device OLED in correspondence to a data signal.

The organic light emitting device OLED may emit light in a prescribed luminance in correspondence to the current amount provided from the pixel circuit CC. To this end, a level of the first power supply voltage ELVDD may be set higher than that of a second power supply voltage ELVSS.

Each of the plurality of transistors T1 to T7 may include an input electrode (or source electrode), an output electrode (or drain electrode), and a control electrode (or gate electrode). For the convenience of a description, one of the input electrode and the output electrode may be referred to as a first electrode, and the other may be referred to as a second electrode.

The first electrode of the first transistor T1 is connected to the first power supply voltage ELVDD via the fifth transistor T5, and the second electrode is connected to an anode electrode of the organic light emitting device OLED via the sixth transistor T6. The first transistor T1 may be referred to as a driving transistor in the present specification.

The first transistor T1 controls a current amount flowing through the organic light emitting device OLED in correspondence to a voltage applied to the control electrode.

The second transistor T2 is connected between the data line DL and the first electrode of the first transistor T1. In addition, the control electrode of the second transistor T2 is connected to an i-th scan line SLi. The second transistor T2 is turned on when the i-th scan signal Si is provided to the i-th scan line SLi, and electrically connects the data line DL to the first electrode of the first transistor T1.

The third transistor T3 is connected between the second electrode and the control electrode of the first transistor T1. The control electrode of the third transistor T3 is connected to the i-th scan line SLi. The third transistor T3 is turned on when the i-th scan signal Si is provided to the i-th scan line SLi, and electrically connects the second electrode and the control electrode of the first transistor T1. Accordingly, when the third transistor T3 is turned on, the first transistor T1 may be a diode-connected transistor, serving as a diode.

The fourth transistor T4 is connected between a node ND and an initialization power generation unit (not shown). In addition, the control electrode of the fourth transistor T4 is connected to the (i-1)-th scan line SLi-1. The fourth transistor T4 is turned on when an (i-1)-th scan signal Si-1 is provided to the (i-1)-th scan line SLi-1, and provides an initialization voltage Vint to the node ND.

The fifth transistor T5 is connected between the power line PL and the first electrode of the first transistor T1. The control electrode of the fifth transistor T5 is connected to an i-th light emission control line ECLi.

The sixth transistor T6 is connected between the second electrode of the first transistor T1 and the anode electrode of the organic light emitting device OLED. In addition, the control electrode of the sixth transistor T6 is connected to the i-th light emission control line ECLi.

The seventh transistor T7 is connected between the initialization power generation unit and the anode electrode of the organic light emitting device OLED. In addition, the control electrode of the seventh transistor T7 is connected to the (i+1)-th scan line SLi+1. The seventh transistor T7 is turned on when the (i+1)-th scans signal Si+1 is provided to the (i+1)-th scan line SLi+1, and provides the initialization voltage Vint to the anode electrode of the organic light emitting device OLED.

The seventh transistor T7 may improve black level representation capability of the pixel PX. In detail, when the seventh transistor T7 is turned on, a parasitic capacitor (not shown) of the organic light emitting device OLED is discharged. Thus, at the time of implementing the black luminance, the organic light emitting device OLED does not emit light due to leakage current from the first transistor T1, and accordingly, the black level representation capability may be improved.

In FIG. 3, the control electrode of the seventh transistor T7 is connected to the (i+1)-th scan line SLi+1. The present inventive concept is not limited thereto. For example, the control electrode of the seventh transistor T7 may be connected to the i-th scan line SLi or a (i-1)-th scan line SLi-1.

In FIG. 3, the transistors T1 to T7 are formed of a P-type metal-oxide-semiconductor (PMOS) transistor. The inventive concept is not limited thereto. For example, the transistors T1 to T7 may be formed of an N-type metal-oxide-semiconductor (NMOS) transistor. For example, an NMOS transistor and a PMOS transistor may be used together to form the pixel PX of FIG. 3.

The capacitor CP is disposed between the power line PL and the node ND. In a non-light emission period NEP during a time when a light emission control signal Ei stays in a high level E-HIGH, thereby the transistors T5 and T6 staying turned off, the capacitor CP stores a voltage corresponding to a data signal. In a light emission period LEP during a time when the light emission control signal Ei stays in a low level E-LOW, thereby the transistors T5 and T6 staying turned on, a current amount flowing through the first transistor may be determined according to the voltage stored by the capacitor CP in the non-light emission period NEP.

The structure of the pixel PX in the inventive concept is not limited to that illustrated in FIG. 3. For example, the pixel PX may be implemented in various types to drive the organic light emitting device OLED.

In FIG. 4, the light emission control signal Ei has a high level E-HIGH and a low level E-LOW. Each of the scan signals Si−1, Si, and Si+1 has a high level S-HIGH and a low level S-LOW.

When the light emission control signal Ei has the high level E-HIGH in the non-light emission period NEP, the fifth transistor T5 and the sixth transistor T6 are turned off. When the fifth transistor T5 is turned off, the power line PL is electrically cut off from the first electrode of the first transistor T1. When the sixth transistor T6 is turned off, the second electrode of the first transistor T1 is electrically cut off from the anode electrode of the organic light emitting device OLED. Accordingly, in the non-light emission period NEP when the light emission control signal Ei has the high level E-HIGH, the organic light emitting device OLED does not emit light. The light emission control signal Ei is supplied to the i-th light emission control line ECLi by the control signal driver 100 of FIG. 2A.

In the non-light emission period NEP, when the (i−1)-th scan signal Si−1, which is provided to the (i−1)-th scan line SLi−1, has the low level S-LOW, the fourth transistor T4 is turned on. When the fourth transistor 14 is turned on, the initialization voltage Vint is provided to the node ND.

In the non-light emission period NEP, when the i-th scan signal Si, which is provided to the i-th scan line SLi, has the low level. S-LOW, the second transistor 12 and the third transistor T3 are turned on.

When the second transistor T2 is turned on, the data signal is provided to the first electrode of the first transistor T1. At this point, since the node ND is initialized to have the initialization voltage Vint, the first transistor T1 is turned on. When the first transistor T1 is turned on, a voltage corresponding to the data signal is provided to the node ND. At this point, the capacitor CP stores the voltage corresponding to the data signal.

When the (i+1)-th scan signal Si+1, which is provided to the (i+1)-th scan line SLi+1, has the low level S-LOW, the seventh transistor T7 is turned on.

When the seventh transistor T7 is turned on, the initialization voltage Vint is provided to the anode electrode of the organic light emitting device OLED and then the parasitic capacitor of the organic light emitting device OLED is discharged.

In the light emission period LEP during a time when the light emission control signal Ei to be provided to the light emission control line ECLi has the low level E-LOW, the fifth transistor T5 and the sixth transistor T6 are turned on. When the fifth transistor T5 is turned on, the first power supply voltage ELVDD is provided to the first electrode of the first transistor T1. When the sixth transistor T6 is turned on, the second electrode of the first transistor T1 is electrically connected to the anode electrode of the organic light emitting device OLED. Then, the organic light emitting device OLED generates light of a prescribed luminance in correspondence to the received current amount.

Figure 5:
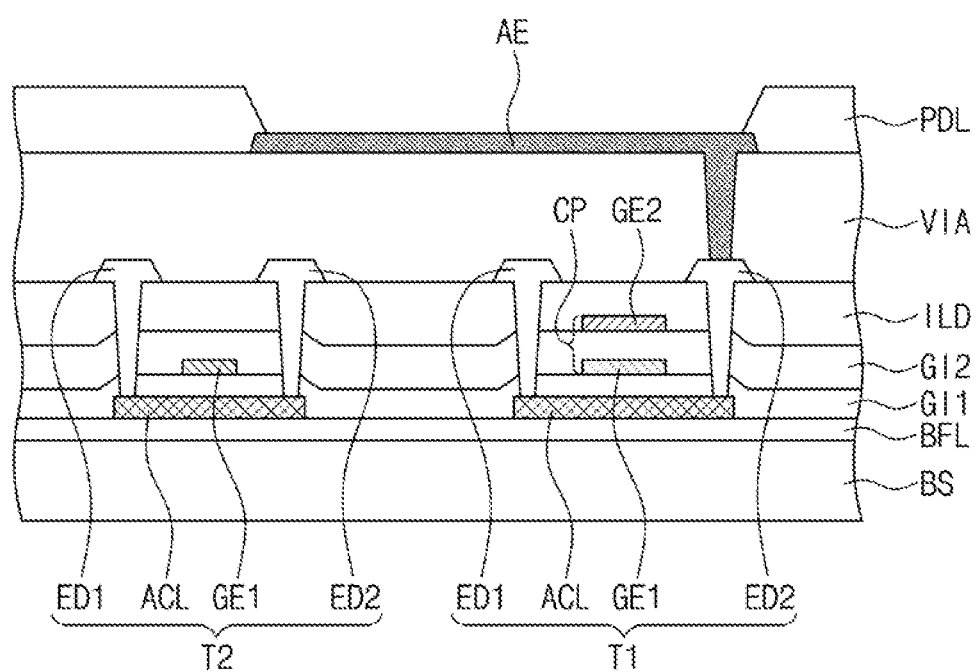
FIG. 5 illustrates a cross-section of a part of a pixel according to an embodiment of the inventive concept.

FIG. 5 illustrates a cross-section of a part of the pixel PX according to an embodiment of the inventive concept. In FIG. 5, the first transistor T1 and the second transistor T2 are exemplarily illustrated, but the inventive concept is not limited thereto. In FIG. 5, the second electrode ED2 of the first transistor T1 seems to directly contact the anode electrode AE of the pixel PX, but this is due to the shape on the cross section. Actually, as shown in FIG. 3, the first transistor T1 is connected to the anode electrode AE of the pixel PX via the sixth transistor T6. However, the inventive concept is not limited thereto. For example, as shown in FIG. 5, the second electrode ED2 of the first transistor T1 may be in direct contact with the anode electrode AE of the pixel PX.

The display panel DP includes a base substrate BS, a buffer layer BFL, gate insulation layers GI1 and GI2, an intermediate insulation layer ILD, a passivation layer VIA, and a pixel defining layer PDL.

The buffer layer BFL is disposed on one surface of the base substrate BS.

The buffer layer BFL may prevent purities of the base substrate BS from flowing into the pixel PX in a manufacturing process. For example, the buffer layer BFL may prevent the purities from being diffused to active units ACL of the transistors T1 and T2 that form the pixel PX.

The purities may be flowed thereinto from the outside, or generated by thermal decomposition of the base substrate BS. The impurities may be a gas or sodium emitted from the base substrate BS. In addition, the buffer layer BFL may block moisture from being flowed into the pixel PX from the outside.

The Active units ACL respectively forming the transistors T1 and T2 are disposed on the base substrate BFL. Each of the active units ACL may include polysilicon or amorphous silicon. Besides, the active units ACL may include metal-oxide semiconductor.

The active units ACL may include a channel area through which an electron or a hole moves, and first and second ion-doped areas disposed with the channel area therebetween.

The first gate insulation layer GI1 covering the active units ACL is disposed on the buffer layer BFL. The first gate insulation layer GI1 includes an organic film and/or an inorganic film. The first gate insulation layer GI1 may include a plurality of inorganic thin films. The plurality of inorganic thin films may include a silicon nitride layer and a silicon oxide layer.

Control electrodes GE1 respectively forming the transistors T1 and T2 are disposed on the first gate insulation layer GI1. The control electrode GE1 of the first transistor T1 may be one of two electrodes that form the capacitor CP. At least a part among the scan lines (SL, see FIG. 2) and light emission control lines (ECL, see FIG. 2) may be disposed on the first gate insulation layer GI1.

The second gate insulation layer GI2 covering the control electrodes GE1 is disposed on the first gate insulation layer GI1. The second gate insulation layer GI2 includes an organic film and/or an inorganic film. The second gate insulation layer GI2 may include a plurality of inorganic thin films. The plurality of inorganic thin films may include a silicon nitride layer and a silicon oxide layer.

The other electrode GE2 of the two electrodes forming the capacitor CP (see FIG. 3) is disposed on the second gate insulation layer GI2. In other words, the electrode GE1 disposed on the first gate insulation layer GI1 and the electrode GE2 disposed on the second gate insulation layer GI2 overlap to form the capacitor CP shown in FIG. 3. However, the structure in which the electrodes forming the capacitor CP are disposed is not limited thereto.

The intermediate insulation layer ILD covering the electrode GE2 is disposed on the second gate insulation layer GI2. The intermediate insulation layer ILD includes an organic film and/or an inorganic film. The intermediate insulation layer ILD may include a plurality of inorganic thin films. The plurality of the inorganic thin films may include a silicon nitride layer and a silicon oxide layer.

At least a part of the data lines (DL, see FIG. 2) and the power lines (PL, see FIG. 2) may be disposed on the intermediate insulation layer ILD. The first electrodes ED1 and the second electrodes ED2 of the transistors T1 and T2 may be disposed on the intermediate insulation layer ILD.

The first electrode ED1 and the second electrodes ED2 may be respectively connected to the corresponding active units ACL through through-holes that penetrate the gate insulation layers GI1 and GI2 and the intermediate insulation layer ILD.

The passivation layer VIA covering the first electrodes ED1 and the second electrodes ED2 is disposed on the intermediate insulation layer ILD. The passivation layer VIA may include an organic film and/or an inorganic film. The passivation layer VIA may provide a planar surface.

The pixel defining layer PDL and the organic light emitting device OLED are disposed on the passivation layer VIA. For the convenience of a description, in FIG. 5, only the anode electrode AE of the organic light emitting device OLED is shown. A light emitting layer, an electron transport layer, and a cathode will be formed to constitute the organic light emitting device OLED.

Figure 6:
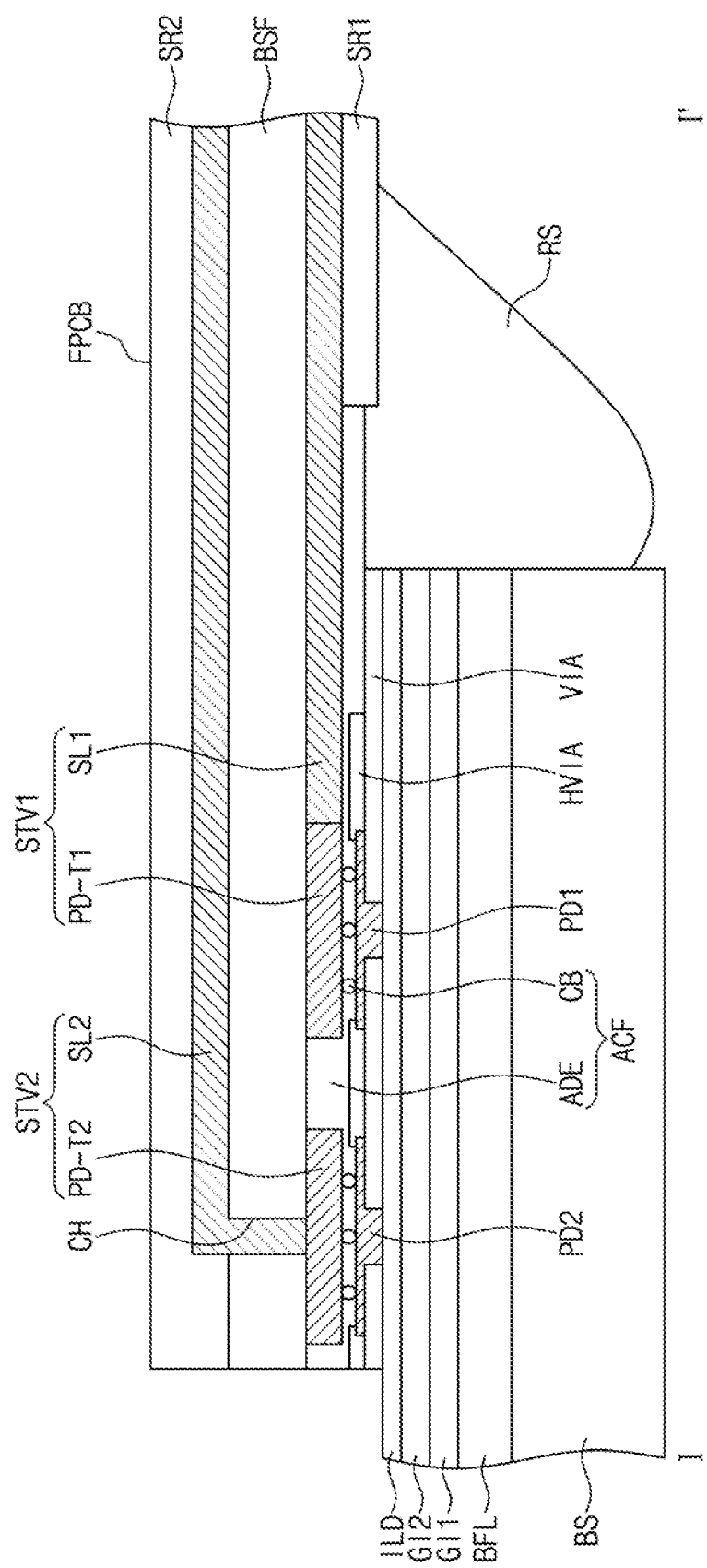
FIG. 6 illustrates a cross-section taken along line I-I' in FIG. 2B.

FIG. 6 illustrates a cross-section taken along line I-I' in FIG. 2B.

A first data pad PD1 and a second data pad PD2 may be disposed on the passivation layer VIA. The first data pad PD1 and the second data pad PD2 may be separated by a half passivation layer HVIA disposed on the passivation layer VIA. The half passivation layer HVIA may include an organic film and/or an inorganic film.

The first data pad PD1 is electrically connected to a first transfer pad PD-T1 through an anisotropic conductive film ACF. The second data pad PD2 is electrically connected to a second transfer pad PD-T2 through the anisotropic conductive film ACF.

The anisotropic conductive film ACF may include a plurality of conductive balls CB and an adhesion member ADE.

The first transfer line SL1 and the first transfer pad PD-T1 are disposed on one surface of the base film BSF. The second transfer line SL2 is disposed on the other surface opposite to the one surface of the base film BSF, and the second transfer pad PD-T2 is disposed on the one surface of the base film BSF.

The second transfer line SL2 is electrically connected to the second transfer pad PD-T2 through a through-hole CH defined in the base film BSF. In the base film BSF, a plurality of through-holes CH may be defined, and in FIG. 6, one through-hole CH is exemplarily illustrated.

The printed circuit board FPCB may further include a first protection member SR1 covering the first signal transfer units STU1, and a second protection member SR2 covering the second signal transfer units STU2. Each of the first protection member SR1 and the second protection member SR2 may include a resin.

A cover part may be disposed on one end of the display panel DP so as to prevent external oxygen and/or moisture from being inserted thereinto. The cover part CRD may include a resin.

Figure 7:
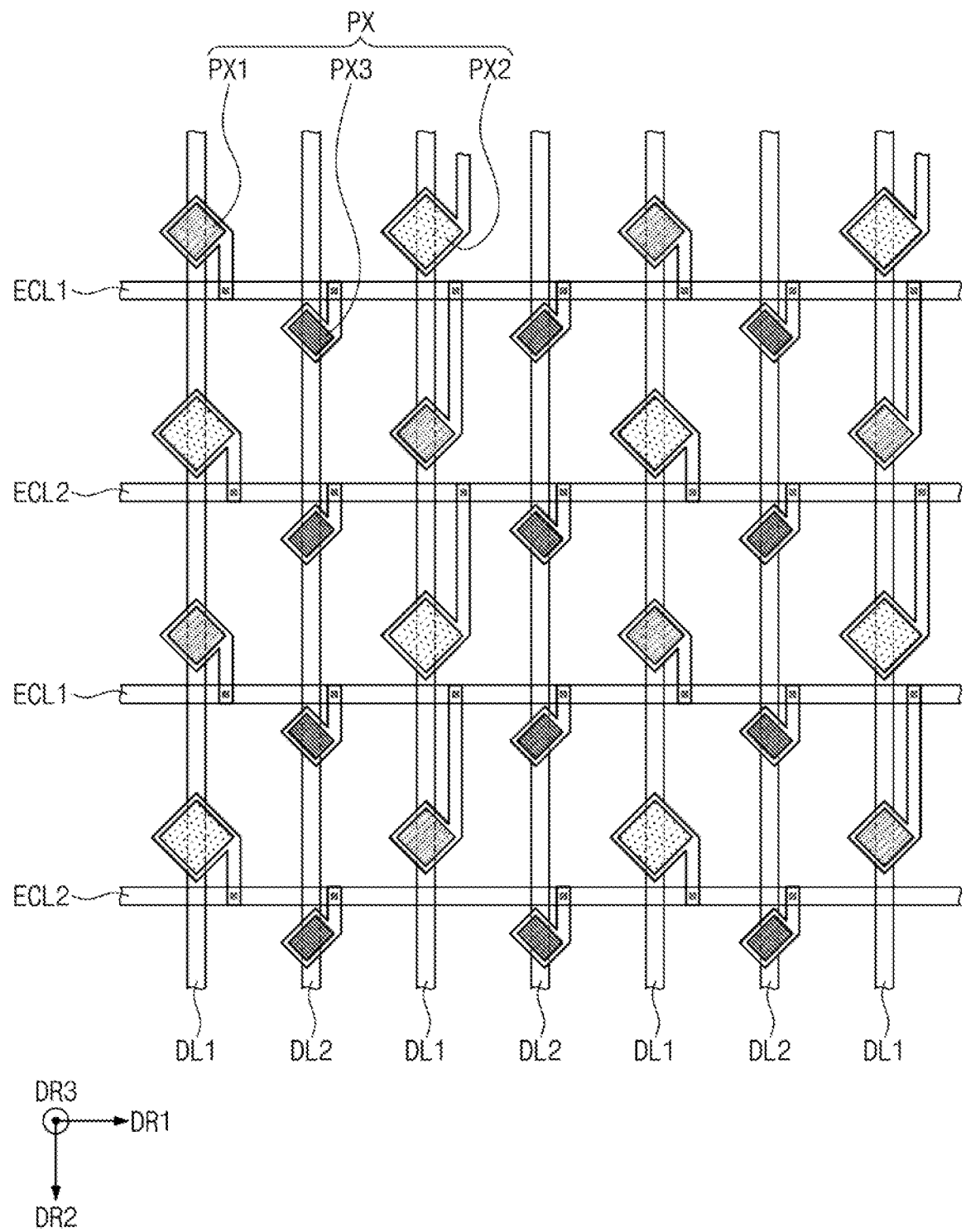
FIG. 7 illustrates a layout of pixels according to an embodiment of the inventive concept.
Figure 8:
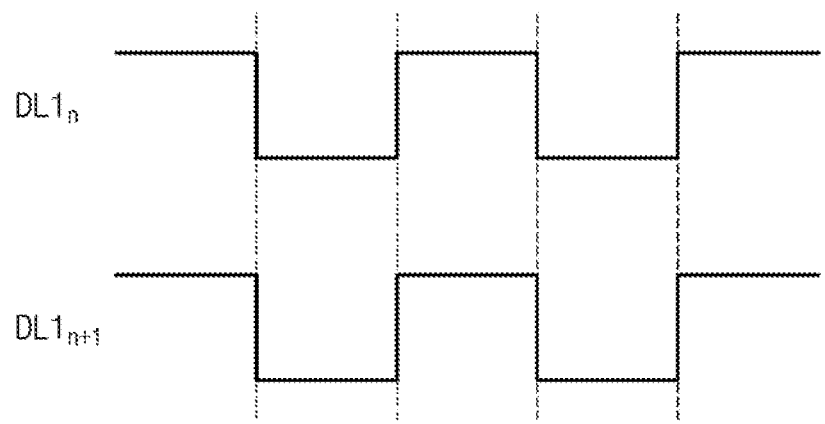
FIG. 8 illustrates data signals to be applied to the pixels illustrated in FIG. 7.

FIG. 7 illustrates a layout of the pixels PX according to an embodiment of the inventive concept. FIG. 8 exemplarily illustrates data signals to be applied to the pixels illustrated in FIG. 7. In FIG. 7, the power lines PL and the scan lines SL are not shown for the convenience of a description.

The first pixels PX1 and the second pixels PX2 are arrayed in a matrix type to form a first pixel group. For example, the first pixels PX1 may be disposed in odd columns of odd rows and in even columns of even rows, and the second pixels PX2 may be disposed in even columns of the odd rows and odd columns of the even rows.

The third pixels PX3 are arrayed in a matrix type to form a second pixel group. The third pixels PX3 may be respectively disposed between two adjacent first pixels PX1 among the first pixels PX1 and between two adjacent two second pixels PX2 among the second pixels PX2.

In FIGS. 2A and 7, pixels PX1 and PX2 disposed in the same row among the first pixels PX1 and the second pixels PX2 are connected to the same scan line SL.

The light emission control lines ECL (see FIG. 2A) may include first light emission control lines ECL1 and second light emission control lines ECL2 according to a connection relation with the first to third pixels PX1 to PX3. The first light emission control lines ECL1 are respectively connected to the first pixels PX1 and the third pixels PX3, and the second light emission control lines ECL2 are respectively connected to the second pixels PX2 and the third pixels PX3.

The first light emission control lines ECL1 respectively provide the light emission control signals to the first pixels PX1 disposed in two adjacent rows among the first pixels PX1, and to the third pixels PX3 disposed in a row among the third pixels PX3. From among the first pixels PX1 and the third pixels PX3, the first pixels PX1 and third pixels PX3 receiving the light emission control signals from the same first light emission control line ECL1 are disposed adjacent to one another.

The second light emission control lines ECL2 respectively provide the light emission control signals to the second pixels PX2 disposed in two adjacent rows among the second pixels PX2, and to the third pixels PX3 disposed in another row among the third pixels PX3. From among the second pixels PX2 and the third pixels PX3, the second pixels PX2 and the third pixels PX3 receiving the light emission control signals from the same second light emission control line ECL2 are disposed adjacent to one another.

The first light emission control lines ECL1 and the second light emission control lines ECL2 are alternately disposed.

For example, the first pixels PX1 and the second pixels PX2 are alternately arranged in a row direction (DR1) and in a column direction (DR2) such that odd rows and even rows have different sequence of the first pixels PX1 and the second pixels PX2, and odd columns and even columns have different sequence of the first pixels and the second pixels PX2. For the convenience of a description, 4×4 matrix array of the first pixels PX1 and the second pixels PX2 is assumed. In this case, each of the odd rows has a sequence of a first pixel PX1, a second pixel PX2, a first pixel PX1 and a second pixel PX2; each of the even rows has a sequence of a second pixel PX2, a first pixel PX1, a second pixel PX2 and a first pixel PX1; each of the odd columns has a sequence of a first pixel. PX1, a second pixel PX2, a first pixel PX1 and a second pixel PX2; and each of the even columns has a second pixel PX2, a first pixel PX1, a second pixel PX2 and a first pixel PX1. In this arrangement of the first and second pixels PX1 and PX2, the first pixels PX1 among the first pixels PX1 and the second pixels PX2 are connected to first light emission control lines ECL1 and the second pixels among the first pixels PX1 and the second pixels PX2 are connected to second light emission control lines ECL2. For example, the third pixels PX3 are connected to the first and second light emission control lines ECL1 and ECL2.

For the electrical connections between the first pixels FX1 and the first light emission control lines ECL1, various physical arrangements therebetween may be implemented. For example, the first pixels PX1 connected to each first light emission control line ECL1 are alternately connected to each first light emission control line ECL1. In other words, each first light emission control line ECL1 is extended in the first direction DR1 between two adjacent first pixels PX1 positioned in two adjacent rows. For example, the second pixels PX2 connected to each second light emission control line ECL2 are alternately connected to each second light emission control line ECL2. In other words, each second light emission control line ECL2 is extended in the first direction DR1 between two adjacent second pixels PX2 positioned in two adjacent rows.

Descriptions about the first data lines DL1 and the second data lines DL2 are substantially the same as those provided with respect to FIGS. 2A and 2B, and thus will be omitted.

According to a connection relationship between the pixels PX1 to PX3 illustrated in FIG. 7 and the light emission control lines ECL1 and ECL2, voltages of the same level are applied to the two adjacent first data lines DL1, when a red color or a blue color is displayed on the display area DA (see FIG. 1). Accordingly, there is scarcely a difference between the first data lines DL1 and thus occurrence of a short circuit may be prevented between the first data lines DL1.

In detail, FIG. 8 exemplarily illustrates that data signals for emitting red color light are applied through an nth first data line $DL1_n$ and an (n+1)-th first data line $DL1_{n+1}$ among the first data lines DL1. As shown in FIG. 8, according to an embodiment of the inventive concept, no voltage difference exists between the data signals applied to the n-th first data line $DL1_n$ and the (n+1)-th first data line $DL1_{n+1}$.

Although the exemplary embodiments of the present invention have been described, it is understood that the present invention should not be limited to these exemplary embodiments, but various changes and modifications can be made by one ordinary skilled in the art within the spirit and scope of the present invention as hereinafter claimed. In addition, embodiments disclosed in the inventive concept are not intended to limit the technical spirit of the inventive concept, and the protection scope of the present invention should be interpreted based on the following appended claims and it should be appreciated that all technical spirits included within a range equivalent thereto are included in the protection scope of the present invention.

What is claimed is:

1. A display module comprising:
a first pixel group comprising a plurality of pixels arrayed in a matrix type,
wherein the plurality of pixels comprise:
a plurality of first pixels disposed in odd columns of odd rows and even columns of even rows; and
a plurality of second pixels disposed in even columns of the odd rows and odd columns of the even rows,
wherein each of the plurality of first pixels emits first light, and each of the plurality of second pixels emits second light having a different color from the first light;
a second pixel group comprising a plurality of third pixels arrayed in a matrix type,
wherein each of the plurality of third pixels emits third light having a different color from the first light and the second light;
a data line group comprising:
a plurality of first data lines configured to provide data signals to the first pixel group; and
a plurality of second data lines configured to provide data signals to the second pixel group; and
a light emission control line group comprising a plurality of first light emission control lines and a plurality of second light emission control lines disposed alternately,
wherein each of the plurality of first light emission control lines provides a first light emission control signal to first pixels disposed in corresponding first two adjacent rows among the plurality of first pixels, and each of the plurality of second light emission control lines provides a second light emission control signal to second pixels disposed in corresponding second two adjacent rows among the plurality of second pixels, and
wherein each of the plurality of first light emission control lines extends between the corresponding first two adjacent rows, and
wherein each of the plurality of second light emission control lines extends between the corresponding second two adjacent rows.

2. The display module of claim 1,
wherein each of the plurality of first light emission control lines provides the first light emission control signal to third pixels, among the plurality of third pixels, disposed in a row between the corresponding first two adjacent rows, the third pixels of the row being disposed between two adjacent first pixels among the plurality of first pixels, and
wherein each of the plurality of second light emission control lines provides the second light emission control signal to third pixels, among the plurality of third pixels, disposed in another row between the corresponding second two adjacent rows, the third pixels of another row being disposed between two adjacent second pixels among the plurality of second pixels.

3. The display module of claim 2,
wherein the plurality of first data lines are respectively and electrically connected to corresponding first pixels among the plurality of first pixels and corresponding second pixels among the plurality of second pixels, and the plurality of second data lines are respectively and electrically connected to corresponding third pixels among the plurality of third pixels.

4. The display module of claim 1, wherein the first light has one of a red color and a blue color, the second light has the other of the red color and the blue color, and the third light has a green color.

5. The display module of claim 1, further comprising:
a first data pad part comprising a plurality of first data pads electrically connected to the plurality of first data lines; and a second data pad part comprising a plurality of second data pads electrically connected to the plurality of second data lines.

6. The display module of claim 5, wherein the second data pad part is disposed between the first data pad part and the first pixel group.

7. The display module of claim 6, further comprising: a printed circuit board,
wherein the printed circuit board comprises:
a base film in which a plurality of through-holes are defined;
a plurality of first signal transfer units respectively and electrically connected to the plurality of first data pads; and
a plurality of second signal transfer units respectively and electrically connected to the plurality of second data pads.

8. The display module of claim 7, wherein each of the plurality of first signal transfer units comprises:
a first transfer pad disposed on one surface of the base film; and
a first transfer line extended from the first transfer pad, and each of the plurality of second signal transfer units comprises:
a second transfer pad disposed on the one surface of the base film; and
a second transfer line disposed on another surface opposite to the one surface of the base film and electrically connected to the second transfer pad through a through-hole.

9. The display module of claim 7, further comprising: a data driver embedded in the printed circuit board,
wherein the data driver provides pulse wave signals to the plurality of first data pads through the plurality of first signal transfer units.

10. The display module of claim 9, wherein the data driver provides DC signals to the plurality of second data pads through the plurality of second signal transfer units.

11. The display module of claim 1, further comprising: a scan line group comprising a plurality of scan lines,
wherein the plurality of scan lines respectively provide scan signals to pixels disposed in a row among the plurality of pixels of the first pixel group, and third pixels disposed in a row among the plurality of third pixels of the second pixel group.

12. The display module of claim 11, wherein the pixels disposed in the row among the plurality of pixels of the first pixel group comprise a part of the plurality of first pixels and a part of the plurality of second pixels.

13. A display module comprising:
a plurality of first pixels each emitting first light having a first color;
a plurality of second pixels each emitting second light having a second color different from the first color;
a plurality of third pixels each emitting third light having a third color different from the first color and the second color;
a plurality of first data lines configured to respectively provide data signals to corresponding first pixels among the plurality of first pixels and corresponding second pixels among the plurality of second pixels;
a plurality of second data lines configured to respectively provide data signals to corresponding third pixels among the plurality of third pixels;
a plurality of first light emission control lines configured to respectively provide light emission control signals to only corresponding first pixels and corresponding third pixels among the plurality of first pixels, the plurality of second pixels and the plurality of third pixels; and
a plurality of second light emission control lines configured to respectively provide light emission control signals to only corresponding second pixels and corresponding third pixels among the plurality of first pixels, the plurality of second pixels and the plurality of third pixels.

14. The display module of claim 13, wherein the plurality of first light emission control lines and the plurality of second light emission control lines are alternately disposed.

15. The display module of claim 13, wherein the first color has one of a red color and a blue color, the second color has the other of the red color and the blue color, and the third color has a green color.

16. The display module of claim 13, wherein the plurality of first pixels and the plurality of second pixels form a first pixel group arrayed in a matrix type, and
the plurality of third pixels form a second pixel group arrayed in a matrix type.

17. The display module of claim 16, wherein each of the plurality of first pixels and each of the plurality of second pixels are disposed alternately in a row direction and a column direction, and
the plurality of third pixels are respectively disposed between two adjacent first pixels among the plurality of first pixels and two adjacent second pixels among the plurality of second pixels.

18. The display module of claim 13, further comprising: a plurality of scan lines,
wherein the plurality of scan lines respectively provide scan signals to corresponding first pixels among the plurality of first pixels, corresponding second pixels among the plurality of second pixels, and corresponding third pixels among the plurality of third pixels.

19. The display module of claim 13, further comprising:
a first data pad part comprising a plurality of first data pads electrically connected to the plurality of first data lines; and
a second data pad part comprising a plurality of second data pads electrically connected to the plurality of second data lines and disposed between the first data pad part and the plurality of first pixels.

20. The display module of claim 19, further comprising:
a printed circuit board comprising: a plurality of first signal transfer units electrically connected to the plurality of first data pads; and a plurality of second signal transfer units electrically connected to the plurality of second data pads; and
a data driver embedded in the printed circuit board and configured to provide pulse wave signals to the plurality of first data pads through the plurality of first signal transfer units, and provide DC signals to the plurality of second data pads through the plurality of second signal transfer units.

* * * * *